United States Patent [19]

Ruckel et al.

[11] Patent Number: 5,521,790

[45] Date of Patent: May 28, 1996

[54] ELECTROSTATIC CHUCK HAVING RELATIVELY THICK AND THIN AREAS AND MEANS FOR UNIFORMLY COOLING SAID THICK AND THIN AREAS DURING CHUCK ANODIZATION

[75] Inventors: Raymond R. Ruckel, Garrison; Robert E. Tompkins, Pleasant Valley; Robert P. Westerfield, Jr., Montgomery, all of N.Y.

[73] Assignee: International Business Machines Corporation, Armonk, N.Y.

[21] Appl. No.: 241,527

[22] Filed: May 12, 1994

[51] Int. Cl.⁶ .................................................. H02N 13/00
[52] U.S. Cl. ............................................. 361/234; 279/128
[58] Field of Search .................................... 361/230, 234, 361/235; 269/8, 903; 279/128

[56] References Cited

U.S. PATENT DOCUMENTS

| 4,184,188 | 1/1980 | Briglia ................................. 361/234 |
| 4,399,016 | 8/1983 | Tsukada et al. . |
| 4,565,601 | 1/1986 | Kakehi et al. . |
| 4,645,218 | 2/1987 | Ooshio et al. . |
| 4,859,304 | 8/1989 | Cathey et al. . |
| 5,055,964 | 10/1991 | Logan et al. ............................. 361/234 |
| 5,115,858 | 5/1992 | Fitch et al. . |
| 5,155,652 | 10/1992 | Logan et al. ............................. 361/234 |

FOREIGN PATENT DOCUMENTS

| 1146328 | 6/1989 | Japan . |
| 1200625 | 8/1989 | Japan . |
| 33250 | 1/1991 | Japan . |
| 33251 | 1/1991 | Japan . |

OTHER PUBLICATIONS

G. Fortuno et al., "Electrostatic Wafer Holder for Wafer Cooling During Reactive Ion Etching", IBM Tech. Discl. Bulletin, vol. 31, No. 1, Jun. 1988, pp. 462–464.

*Primary Examiner*—Jeffrey A. Gaffin

[57] ABSTRACT

An aluminum electrostatic chuck for holding semiconductor wafers during wafer processing. The chuck is characterized by a closely determined magnitude of electrostatic holding force due to an anodization step for creating a finely uniform thickness of dielectric material on the chuck surface facing the wafer which, in turn, determines the holding force. The chuck cross section comprises two different thickness areas with fluid cooling being applied to the thinner thickness area during chuck anodization to assure thickness uniformity of the anodized material across the face of the chuck.

4 Claims, 2 Drawing Sheets

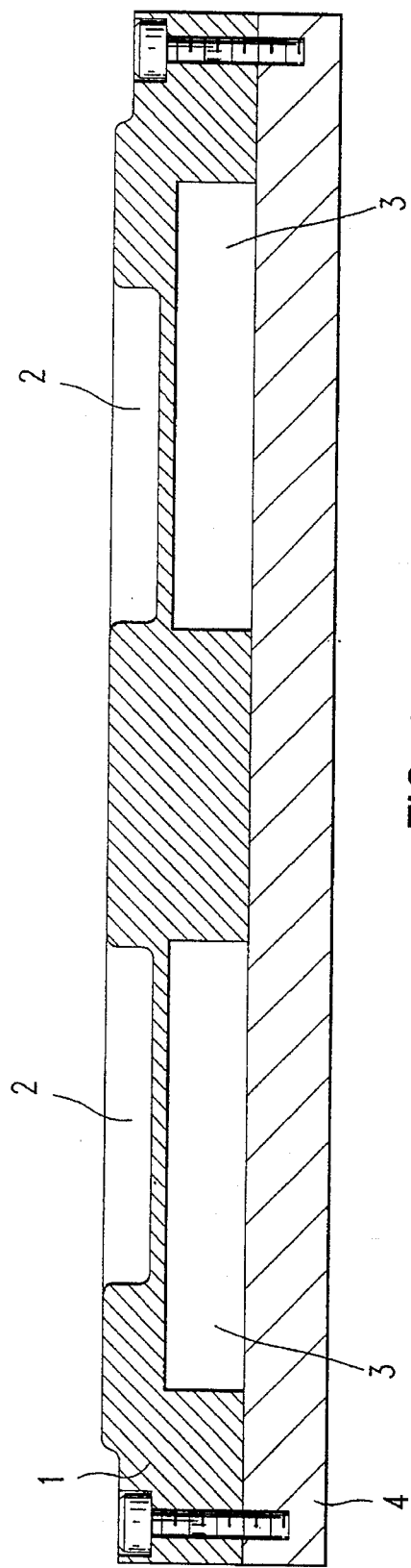
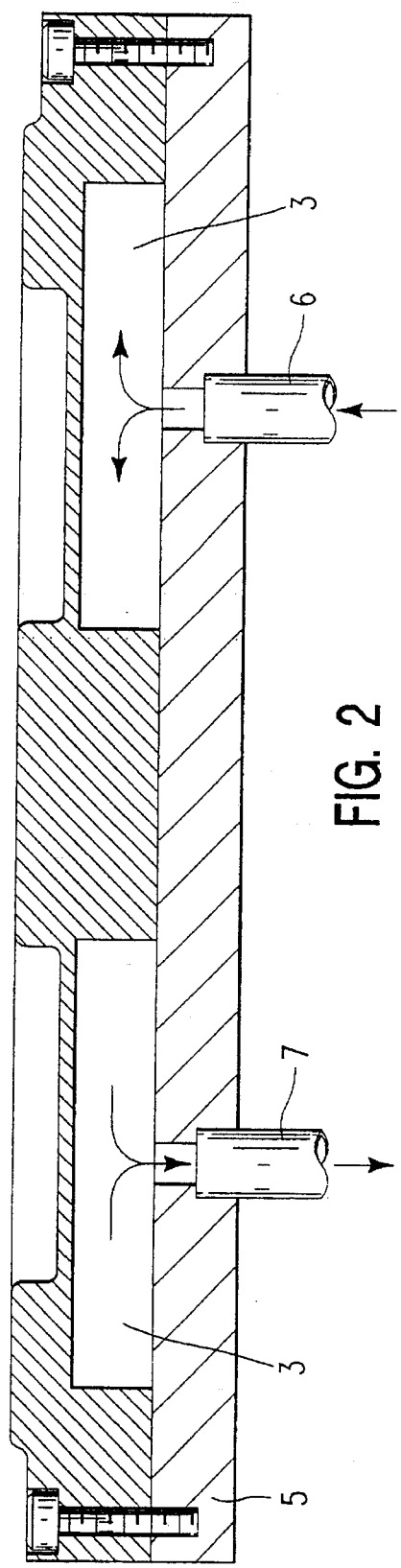

5,521,790

ELECTROSTATIC CHUCK HAVING RELATIVELY THICK AND THIN AREAS AND MEANS FOR UNIFORMLY COOLING SAID THICK AND THIN AREAS DURING CHUCK ANODIZATION

FIELD OF THE INVENTION

The present invention generally relates to electrostatic chucks for clamping semiconductor wafers during wafer processing and, more particularly, to means for more accurately determining the magnitude of the clamping force exerted by the chuck.

BACKGROUND OF THE INVENTION

As is known in the art, the processing of wafers is facilitated if the wafer is clamped substantially flat against a support base or backplate which is temperature controlled during wafer treatment. By clamping the wafer, the number of points of contact between the wafer and the support is increased whereby the thermal conductivity between the wafer and the support is increased and wafer warps are corrected. The improved heat transfer to or from the wafer enables better control of the temperature of the wafer and, hence, better process control. These considerations are discussed, for example, in U.S. Pat. No. 5,055,964, issued on Oct. 8, 1991 to Joseph S. Logan et al, and assigned to the present assignee.

The cited patent further sets forth that in both known types of electrostatic chucks (single area or split area electrode), an electrode is positioned on a support base. An insulator is placed over the electrode and, in turn, the wafer is placed over the insulator. Voltage is applied between the single area electrode and the wafer or between the split areas of the electrodes, as the case may be, creating an electrostatic force of attraction. The amount of electrostatic attraction between energized chuck and wafer depends upon a number of factors, among which is the thickness of the insulator. In order to determine accurately the magnitude of electrostatic attraction, it is necessary that the insulator thickness be formed with close precision, the force of attraction being very sensitive to small thickness deviations.

SUMMARY OF THE INVENTION

One object of the present invention is to provide an electrostatic wafer chuck having a closely controlled preestablished force of attraction when energized.

Another object of the invention is to provide precise anodization thickness on a semiconductor wafer chuck having non-constant cross-sectional thickness.

These and other objects of the present invention are achieved, in a best mode embodiment of the invention, by providing a chuck having a non anodized rear surface and an anodized front surface for holding a semiconductor wafer to be subjected to various processing steps. The cross-sectional thickness of the chuck is of differing thicknesses due to the provision of a recess in the front surface for accommodating the second area of a split area electrode and an aligned recess (or rear coolant cavity) in the rear surface to allow for the flow of a coolant. The rear surface is closed by a backing plate apertured for inlet and outlet of coolant during anodization.

The front surface of the chuck is anodized by immersion in an anodization bath. The anodization (or anodizing) forms an insulating layer whose thickness determines the electrostatic attraction between a wafer and the chuck when the wafer is placed over the front surface of the chuck and the chuck is energized. It has been found that the thickness of the anodized layer, after removal from the bath, is a sensitive function of the chuck thickness and the localized temperature across the front face of the chuck during anodization. In general, the thickness of the anodized layer would be thicker above the thin cross-section than elsewhere on the face of the chuck in the absence of cooling provisions.

In accordance with the present invention, coolant is circulated through the recess in the rear surface of the chuck during anodization to maintain uniformity of temperature across the front face of the chuck and, hence, uniformity of and close control of, the thickness of the resulting anodized layer.

BRIEF DESCRIPTION OF THE DRAWINGS

FIG. 1 is a simplified cross-sectional view of a prior art anodized split electrode electrostatic chuck;

FIG. 2 is a simplified cross-sectional view of a split electrode electrostatic chuck anodized in accordance with the present invention.

BEST MODE OF CARRYING OUT THE INVENTION

Figure 3:
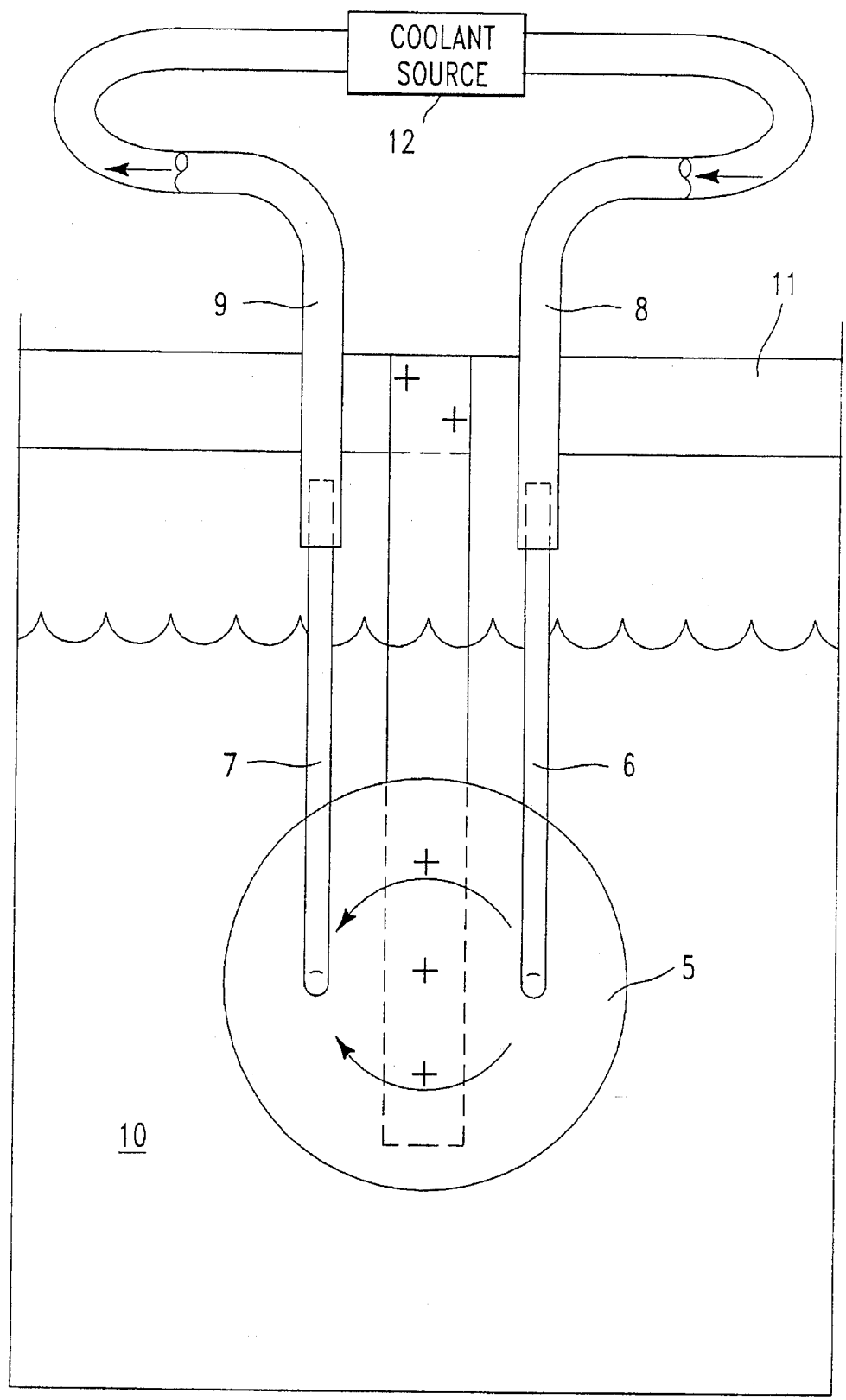
FIG. 3 is a simplified view of the chuck of FIG. 2 being immersed in an anodization bath.

Referring to prior art FIG. 1, aluminum chuck 1 is provided with a front face recess 2 to receive the other split area (not shown) of a split area electrode which fills the recess 2 and coplanarizes the top surface of chuck 1 as described in the aforementioned U.S. Pat. No. 5,055,964. The rear surface of chuck 1 is provided with a recess 3 to allow for the flow of a coolant when the chuck later holds a semiconductor wafer during wafer processing. At such time, the rear surface is enclosed by a suitable backing plate (not shown) allowing for ingress and egress of a coolant. Closed backing plate 4 is brought into tight contact with chuck 1 only during anodization in order to prevent the anodization of the entire rear surface of chuck 1. It is necessary to avoid rear surface anodization for electrical reasons associated with the later wafer processing.

It should be noted at this juncture that although the described best mode involves the use of a split area electrode type chuck, the present invention also is suitable for use with a single area electrode type chuck, in which case recess 2 would be omitted.

With closed backing plate 4 in place, air is trapped in recess 3 and locally inhibits the maintenance of uniform chuck cooling. It has been found in accordance with the making of the invention that the thin area of the chuck directly in contact with the trapped air in the non-anodized pocket formed by the backing plate becomes noticeably more anodized. The increased heat brought about by the trapped air thermal insulator causes "anodization burning" to begin to occur which increases the plating in those area of the chuck contiguous thereto, i.e., in the relatively thin area of the chuck. For example, in one anodization process, a thickness of 0.00195" anodized layer resulted on the thin area of chuck 1 whereas a thickness of 0.00150" was produced on the thick area of the chuck. The non-uniformity of anodized layer thickness adversely affects uniformity of dielectric (anodized layer) breakdown and the magnitude of the electrostatic attraction to a wafer once the chuck is energized. The amount of r.f. voltage drop during some of the wafer treatment steps involving plasma environments also is impacted.

The foregoing problems associated with the thickness non-uniformity of the prior art anodization of the chuck are avoided by use of the present invention as will be described with the aid of FIG. 2. As shown in FIG. 2, the closed backing plate 4 of FIG. 1 is replaced by apertured backing plate 5 backing plate 5 and the chuck together forming a composite workpiece which provides for the flow of fluid coolant entering at fluid inlet 6 and exiting at fluid outlet 7 through the enclosed recess or coolant cavity 3. Thus, the entire chuck is maintained at a uniform temperature through the anodization process which assures uniform plating (anodization) thickness across the entire front face of the chuck.

FIG. 3 depicts the anodization tank set-up using the fluid cooled backing plate 5 of the present invention. It should be noted that inlet 6 and outlet 7 are connected to the fluid source 11 via connecting rubber hoses 8 and 9, respectively, so as to electrically isolate the potential of the anodization bath 10 from the fluid source. Bath potential is applied between positive bus 11 attached to backing plate 5 and negative electrodes (not shown) also immersed in bath 10 in a conventional manner to anodize the surfaces exposed to the anodization bath.

Those skilled in the art will readily appreciate that different embodiments can be made within the spirit and scope of the invention and the following claims are not intended to be limited to the embodiments illustrated.

We claim:

1. A method of anodizing a front surface of an aluminum electrostatic chuck in an anodizing bath, said chuck having a first region of a first thickness and a second region of a second thickness greater than said first thickness, and a rear coolant cavity opposite at least a portion of said first region of said front surface, comprising the steps of:

covering said coolant cavity with a backing plate having fluid inlet and fluid outlet apertures connected to coolant fluid source means, thereby forming a composite workpiece comprising said chuck and said backing plate and including an enclosed cavity encompassing said coolant cavity;

immersing said composite workpiece in said anodization bath; and anodizing said front surface of said chuck while said coolant fluid source means is operating to flow coolant through said enclosed cavity, whereby said coolant cavity is protected from said anodizing bath, said chuck is cooled during said anodization, and heat is removed from said first region.

2. A method according to claim 1, in which said fluid inlet and fluid outlet apertures are connected to said coolant fluid source means by electrically insulating hoses.

3. A method according to claim 2, in which said fluid source means recirculates coolant through said enclosed cavity.

4. A method according to claim 1, in which said fluid source means recirculates coolant through said enclosed cavity.

* * * * *